US007913388B2

(12) United States Patent
Ito

(10) Patent No.: US 7,913,388 B2
(45) Date of Patent: Mar. 29, 2011

(54) INK JET PRINT HEAD AND MANUFACTURING METHOD THEREOF

(75) Inventor: Atsushi Ito, Nagoya (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 558 days.

(21) Appl. No.: 11/716,973

(22) Filed: Mar. 12, 2007

(65) Prior Publication Data

US 2007/0216728 A1 Sep. 20, 2007

(30) Foreign Application Priority Data

Mar. 14, 2006 (JP) ................................ 2006-069043

(51) Int. Cl.

| | |
|---|---|
| ***B23P 17/00*** | (2006.01) |
| ***B21D 53/76*** | (2006.01) |
| ***H01L 41/22*** | (2006.01) |
| ***H04R 17/00*** | (2006.01) |
| ***B41J 2/15*** | (2006.01) |
| ***B41J 2/145*** | (2006.01) |
| ***B41J 2/135*** | (2006.01) |

(52) U.S. Cl. ........... 29/890.1; 29/25.35; 347/40; 347/44

(58) Field of Classification Search ................. 29/890.1, 29/25.35; 347/40, 44, 45
See application file for complete search history.

(56) References Cited

U.S. PATENT DOCUMENTS

| | | | | |
|---|---|---|---|---|
| 6,955,418 | B2 | 10/2005 | Ito | |
| 7,047,643 | B2 * | 5/2006 | Maeda et al. | 29/890.1 |
| 7,540,084 | B2 * | 6/2009 | Kobayashi | 29/890.1 |
| 2005/0068380 | A1 * | 3/2005 | Ito | 347/72 |
| 2005/0185025 | A1 * | 8/2005 | Shimada et al. | 347/68 |
| 2005/0195249 | A1 | 9/2005 | Nakamura et al. | |
| 2005/0253488 | A1 | 11/2005 | Ito | |
| 2006/0021223 | A1 * | 2/2006 | Wakayama et al. | 29/890.1 |

FOREIGN PATENT DOCUMENTS

| | | |
|---|---|---|
| JP | 2004-25636 | 1/2004 |
| JP | 2005-246779 | 9/2005 |
| JP | 2005-322850 | 11/2005 |

* cited by examiner

*Primary Examiner* — A. Dexter Tugbang
*Assistant Examiner* — David P Angwin
(74) *Attorney, Agent, or Firm* — Frommer Lawrence & Haug LLP

(57) ABSTRACT

A nozzle unit having a nozzle, a flow channel unit having a pressure chamber and a through hole to be communicated with the pressure chamber and an actuator for causing the pressure chamber to discharge ink are respectively formed. The nozzle unit and the actuator have substantially the same planar dimensions. In the nozzle unit, a spacer plate having a communicating hole penetrating in the plate thickness direction corresponding to the nozzle is preliminarily bonded with the first plate, which is to be the nozzle plate, and the nozzle is formed at the first plate material through the communicating hole with laser. The nozzle unit and the actuator which have been respectively formed are bonded with the flow channel unit at positions facing each other simultaneously.

4 Claims, 7 Drawing Sheets

INK JET PRINT HEAD AND MANUFACTURING METHOD THEREOF

CROSS-REFERENCE TO RELATED APPLICATIONS

This Nonprovisional application claims priority under 35 U. S. C. §119(a) on Patent Application No. 2006-069043 filed in Japan on Mar. 14, 2006, the entire contents of which are hereby incorporated by reference.

BACKGROUND

The present invention relates to an ink jet print head and a manufacturing method thereof.

In an ink jet printer, as described in Japanese Patent Application Laid-Open Nos. 2004-25636 and 2005-246779, a cavity unit comprising nozzles arranged in lines and pressure chambers for the respective nozzles is joined with a plate-type piezoelectric actuator having energy generating units formed for the pressure chambers and a flexible flat cable is further joined with the rear face thereof so as to form a record head. An ink jet print head is formed by bonding and fixing the record head at a reinforcing frame and mounting the assembly in a head holder having substantially the shape of a box as described in Japanese Patent Application Laid-Open No. 2005-246779, The ink jet print head is constructed to apply pressure for causing the pressure chambers to discharge ink by selectively driving the energy generating units of the actuator so that ink is discharged from the nozzles. A cover plate (a protective cover in Japanese Patent Application Laid-Open No. 2005-246779) is attached to the nozzle face of the record head of the ink jet print head surrounding the cavity unit so as to correct a step between the cavity unit and the reinforcing frame and slightly protrudes downward from the nozzle face so that the nozzles and the nozzle face is kept from being damaged by contact with recording paper during scanning of the head holder.

The cavity unit is constructed by laminating and bonding a plurality of plates sequentially and disposing a nozzle plate having nozzles provided at the bottom layer. Since nozzles which directly jet ink have a direct influence on the quality of ink jet, a high accuracy of machining of the hole size or the nozzle position is required at the time of nozzle machining. Accordingly, a method described in Japanese Patent Application Laid-Open No. 2005-246779 has been employed. A nozzle plate can be machined with a high accuracy of the position and the hole size of the nozzles when a nozzle unit is prepared by bonding a first plate (a nozzle plate in Japanese Patent Application Laid-Open No. 2005-246779), which is to be a nozzle plate, with a second plate (a first spacer plate in Japanese Patent Application Laid-Open No. 2005-246779), which has an opening, at a position corresponding to each nozzle and laser is radiated from the second plate side to the opening. The other plates are then laminated and bonded sequentially on the nozzle unit and an actuator is further laminated and bonded on the top thereof.

SUMMARY

Since a cover plate of an ink jet print head is placed surrounding the nozzle lines circularly, the risk of damage to the nozzle face can be reduced by bringing the perforation position of the nozzles close to the cover plate as much as possible. Since all that is required is the nozzle unit has a width enough for perforation of the nozzles, it is effective to make the entire outer shape of the nozzle unit small so as to reduce the width between the perforation position of the nozzles and the outer frame of the nozzle plate. However, when the entire outer shape of the nozzle unit is as small as the nozzle plate in Japanese Patent Application Laid-Open No. 2004-25636 and the actuator and the nozzle unit have different planar dimensions, pressure (downward) for adhesion in laminating and bonding the cavity unit and the actuator concentrates on a face of a part having a small area and pressure at both ends of a part having a large area becomes insufficient, causing weakening of mutual adhesion and making detachment more likely to occur. For example, when the actuator is larger than the nozzle unit, there is a risk that the operation of the actuator becomes uneven for the respective pressure chambers or ink leaks from the pressure chambers.

Moreover, in a cavity unit constructed by laminating a plurality of plates as described in Japanese Patent Application Laid-Open Nos. 2004-25636 and 2005-246779 wherein the nozzle unit is at the bottom layer, pressure (downward) for adhesion in laminating and bonding the respective plates of the cavity unit in sequence on the nozzle unit concentrates on the nozzle unit and pressure concentrates only on a part between a plurality of plates of the cavity unit corresponding to the nozzle unit. That is, adhesion pressure at both end sides of the cavity unit becomes insufficient and mutual adhesion weakens. Accordingly, there is a risk that the respective plates of the cavity unit become more likely to come off both end sides and ink leaks when the ink enters the cavity unit.

Accordingly, it is preferable to make the nozzle unit have substantially the same size as the cavity unit so that the adhesion pressure in adhesion of the cavity unit becomes equal. In Japanese Patent Application Laid-Open No. 2005-246779, more nozzle lines are provided in comparison to Japanese Patent Application Laid-Open No. 2004-25636, other plates are laminated and bonded so that the nozzle unit has not the width of perforation of nozzle lines but substantially the same size as the cavity unit and the adhesion pressure area becomes equal. However, in terms of protection of the nozzle face, the distance from the position where nozzle lines are actually formed to the cover plate becomes long and the nozzle face becomes more likely to be damaged.

In an attempt to solve the problems above, it is an object to provide an ink jet print head and a manufacturing method thereof capable of bonding a cavity unit and an actuator reliably regardless of the size of a nozzle plate, while ensuring the accuracy of the nozzle position at the nozzle plate.

A manufacturing method of an ink jet print head according to the first aspect is characterized by a manufacturing method of an ink jet print head comprising: a nozzle unit having a nozzle plate in which a nozzle for discharging ink is disposed; a plate flow channel unit which is bonded with the nozzle unit and has a pressure chamber corresponding to the nozzle; and an actuator, which is bonded at a face of the flow channel unit opposite to a face where the nozzle unit is bonded and has a substantially same planar dimension as that of the nozzle unit, for applying pressure to ink in the pressure chamber so as to discharge ink from the nozzle, wherein the nozzle unit, the flow channel unit and the actuator are laminated, the method comprising: a nozzle unit forming step of forming the nozzle unit; a flow channel unit forming step of forming the flow channel unit; an actuator forming step of forming the actuator; and a bonding step of bonding the nozzle unit and the actuator with the flow channel unit at positions facing each other.

A manufacturing method of an ink jet print head according to the second aspect is characterized by a manufacturing method of an ink jet print head comprising: a nozzle unit having a nozzle plate in which a nozzle for discharging ink is disposed; a plate flow channel unit which is bonded with the nozzle unit and has a pressure chamber corresponding to the nozzle; and an actuator, which is bonded at a face of the flow channel unit opposite to a face where the nozzle unit is bonded and has a planar dimension larger than that of the nozzle unit, for applying pressure to ink in the pressure chamber so as to discharge ink from the nozzle, wherein the nozzle unit, the flow channel unit and the actuator are laminated, the method comprising: a nozzle unit forming step of forming the nozzle unit; a flow channel unit forming step of forming the flow channel unit; an actuator forming step of forming the actuator; a bonding step of bonding the actuator with the flow channel unit; and a step of bonding the nozzle unit with the flow channel unit at a position facing the actuator after the bonding step.

A manufacturing method of an ink jet print head according to the third aspect is characterized by a manufacturing method of an ink jet print head comprising: a nozzle unit having a nozzle plate in which a nozzle for discharging ink is disposed; a plate flow channel unit which is bonded with the nozzle unit and has a pressure chamber corresponding to the nozzle; and an actuator, which is bonded at a face of the flow channel unit opposite to a face where the nozzle unit is bonded and has a planar dimension smaller than that of the nozzle unit, for applying pressure to ink in the pressure chamber so as to discharge ink from the nozzle, wherein the nozzle unit, the flow channel unit and the actuator are laminated, the method comprising: a nozzle unit forming step of forming the nozzle unit; a flow channel unit forming step of forming the flow channel unit; an actuator forming step of forming the actuator; a bonding step of bonding the nozzle unit with the flow channel unit; and a step of bonding the actuator with the flow channel unit at a position facing the nozzle unit after the bonding step.

An ink jet print head according to the fourth aspect is characterized by an ink jet print head comprising: a nozzle unit having a nozzle plate in which a nozzle for discharging ink is disposed; a plate flow channel unit which is bonded with the nozzle unit and has a pressure chamber corresponding to the nozzle; and an actuator, which is bonded at a face of the flow channel unit opposite to a face where the nozzle unit is bonded, for applying pressure to ink in the pressure chamber so as to discharge ink from the nozzle, wherein the nozzle unit and the actuator have substantially same planar dimensions and are bonded with the flow channel unit at positions facing each other.

As is clear from the above explanation, regarding the first aspect, the nozzle unit, the flow channel unit and the actuator are respectively formed and the nozzle unit and the actuator, which have substantially the same sizes, are bonded with the flow channel unit at positions facing each other. Accordingly, it is possible to bond the two members with the flow channel unit reliably since substantially the same adhesion pressure is applied to the same position and the two members share the adhesion pressure. Moreover, since the respective parts which have already been formed reliably are bonded with each other, it is possible to maintain the interrelationship with a high accuracy. As a result, it is possible to manufacture an ink jet print head which operates stably without ink leakage while the actuator operates uniformly for the respective pressure chambers.

Regarding the second aspect, the nozzle unit, the flow channel unit and the actuator are respectively formed, and the actuator having a planar dimension larger than that of the nozzle unit is first bonded with the flow channel unit and the nozzle unit is then bonded with the flow channel unit at a position facing the actuator. Accordingly, it is possible to bond the entire actuator uniformly with the flow channel unit without being affected by the area of the nozzle unit and to bond also the nozzle unit with the flow channel unit reliably. Furthermore, since the respective parts which have already been formed reliably are bonded with each other, it is possible to maintain the interrelationship with a high accuracy and to manufacture an ink jet print head which operates stably.

Regarding the third aspect, the nozzle unit, the flow channel unit and the actuator are respectively formed, and the nozzle unit having a planar dimension larger than that of the actuator is first bonded with the flow channel unit and the actuator is then bonded with the flow channel unit at a position facing the nozzle unit. Accordingly, it is possible to bond the entire nozzle unit uniformly with the flow channel unit without being affected by the area of the actuator and to bond also the actuator with the flow channel unit reliably. Furthermore, since the respective parts which have already been formed reliably are bonded with each other, it is possible to maintain the interrelationship with a high accuracy and to manufacture an ink jet print head which operates stably.

Regarding the fourth aspect, in the ink jet print head comprising a nozzle unit, a flow channel unit bonded with the nozzle unit and an actuator bonded at a face of the flow channel unit opposite to a face where the nozzle unit is bonded, the nozzle unit and the actuator have substantially the same planar dimensions and are bonded with the flow channel unit at positions facing each other. Accordingly, the nozzle unit and the actuator can be bonded with the flow channel unit reliably since substantially the same adhesion pressure in bonding the nozzle unit and the actuator with the flow channel unit is applied to substantially the same positions and the nozzle unit and the actuator can share the adhesion pressure. As a result, it is possible to provide an ink jet print head which operates stably without ink leakage while the actuator operates uniformly for the respective pressure chambers.

The above and further objects and features will more fully be apparent from the following detailed description with accompanying drawings.

DETAILED DESCRIPTION OF THE EXEMPLARY EMBODIMENTS

The following description will explain the present embodiment with reference to the drawings. It should be noted that a side from which ink is to be discharged will be referred to as a lower face and downward and the opposite side will be referred to as an upper face and upward in the following explanation. It should also be noted that a head unit 50, which will be described later, is shown in FIG. 3 in a left-right reversal manner with respect to FIGS. 1, 2, 5A and 5B.

Figure 1:
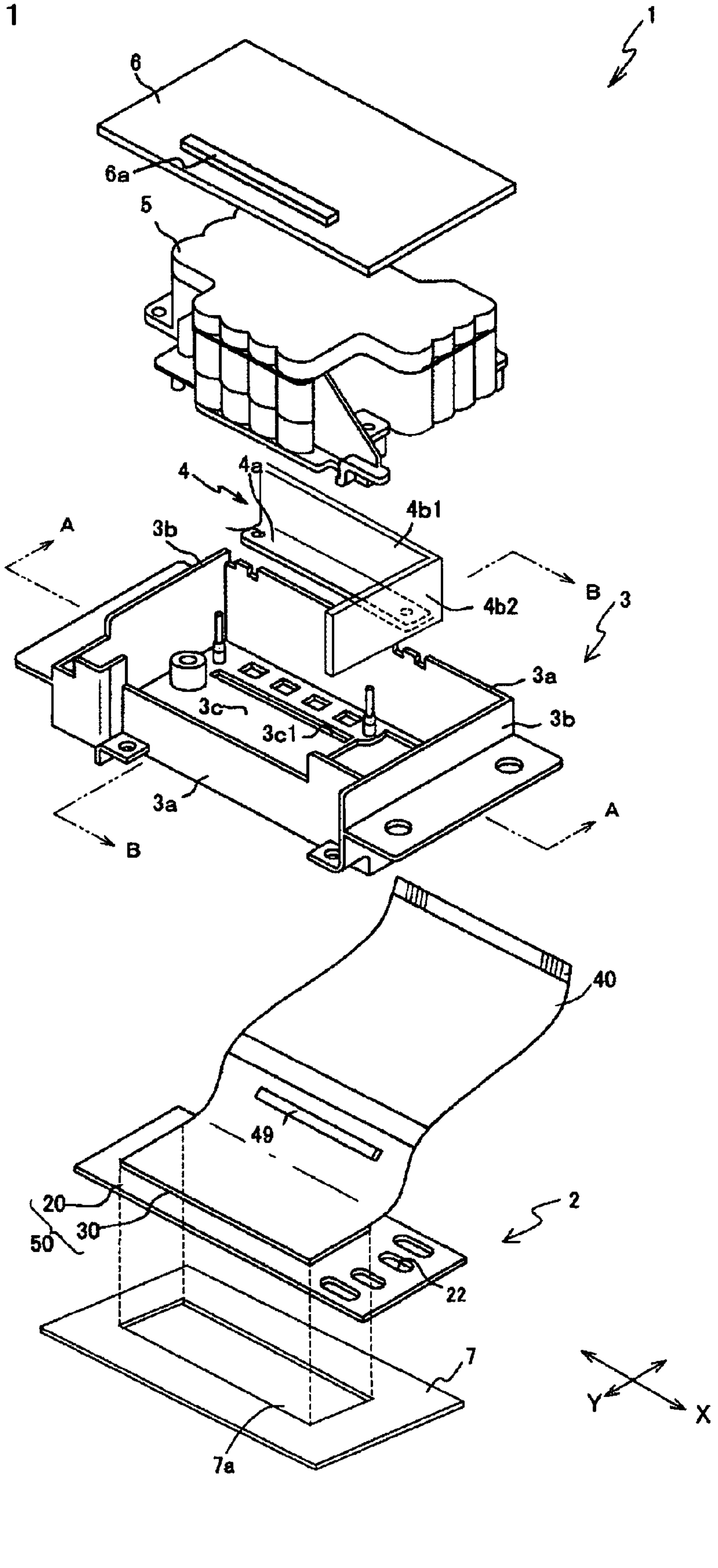
FIG. 1 is an exploded perspective view of an ink jet print head 1.

In an ink jet printer, a head holder 3 which functions as a carriage and has substantially the shape of an open-topped box is attached to a guide shaft and a record head 2 provided with nozzles 9 is fixed at a lower side of a bottom wall 3*c* of the head holder 3 by adhesive (not illustrated) as shown in FIG. 1. Moreover, an ink reservoir 5 for reserving ink of respective colors, e.g. black B, cyan C, magenta M and yellow Y, and supplying ink to the record head 2 and a radiator plate 4 for radiating heat generated by a drive circuit 49 which will be explained later are mounted inside the head holder 3 so as to form an ink jet print head 1. A cover plate 7 for protecting the nozzles 9 is bonded and fixed at a lower side of the record head 2 and a junction circuit board 6 is placed at the top face of the head holder 3 so as to bridge a pair of side walls 3*b* of the head holder 3. When the ink jet print head 1 reciprocates in the width direction of recording paper (Y direction in FIG. 1) and scans recording paper while an actuator 30, which will be explained later, of the record head 2 is selectively driven, ink is discharged from the nozzles 9 and printing on the recording paper is achieved.

Figure 2:
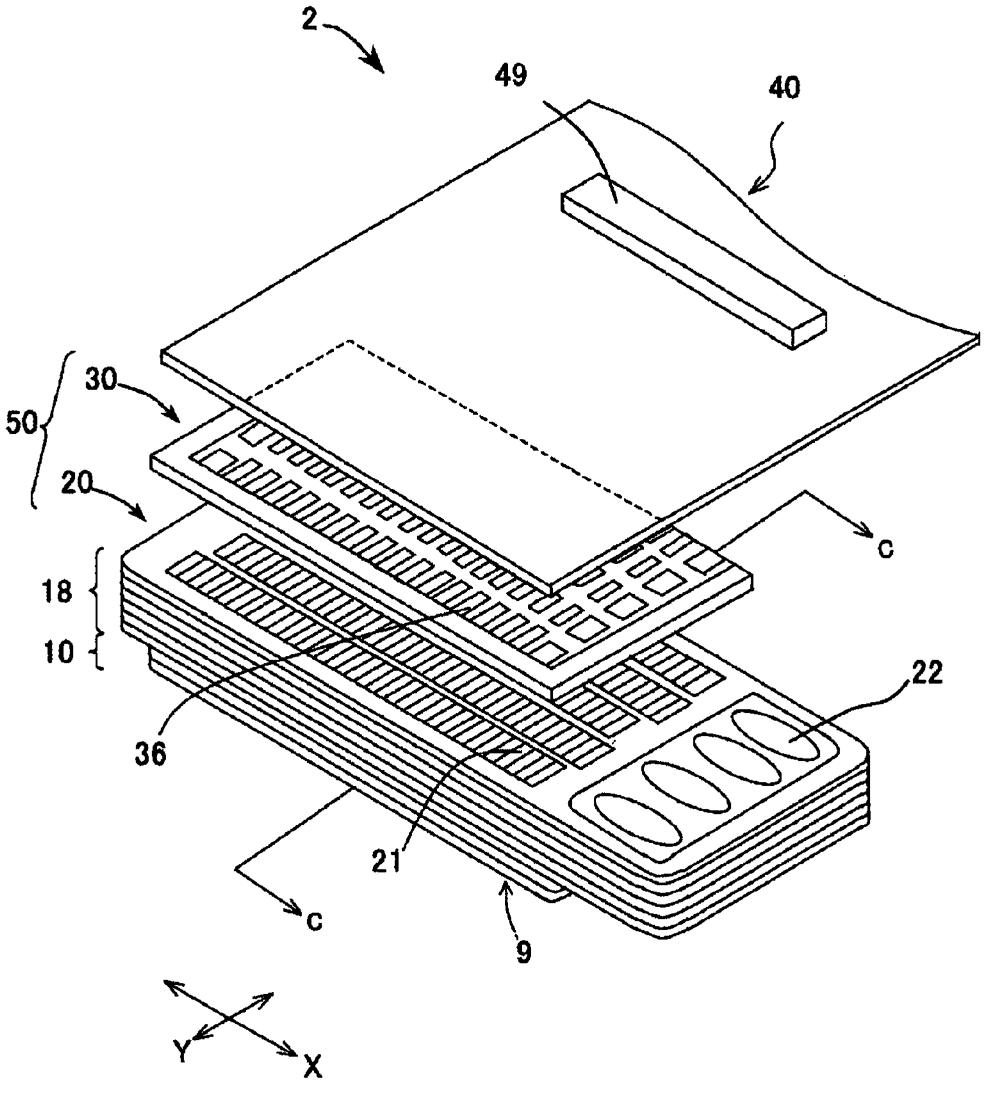
FIG. 2 is a perspective view showing the structure of a record head 2.
Figure 3:
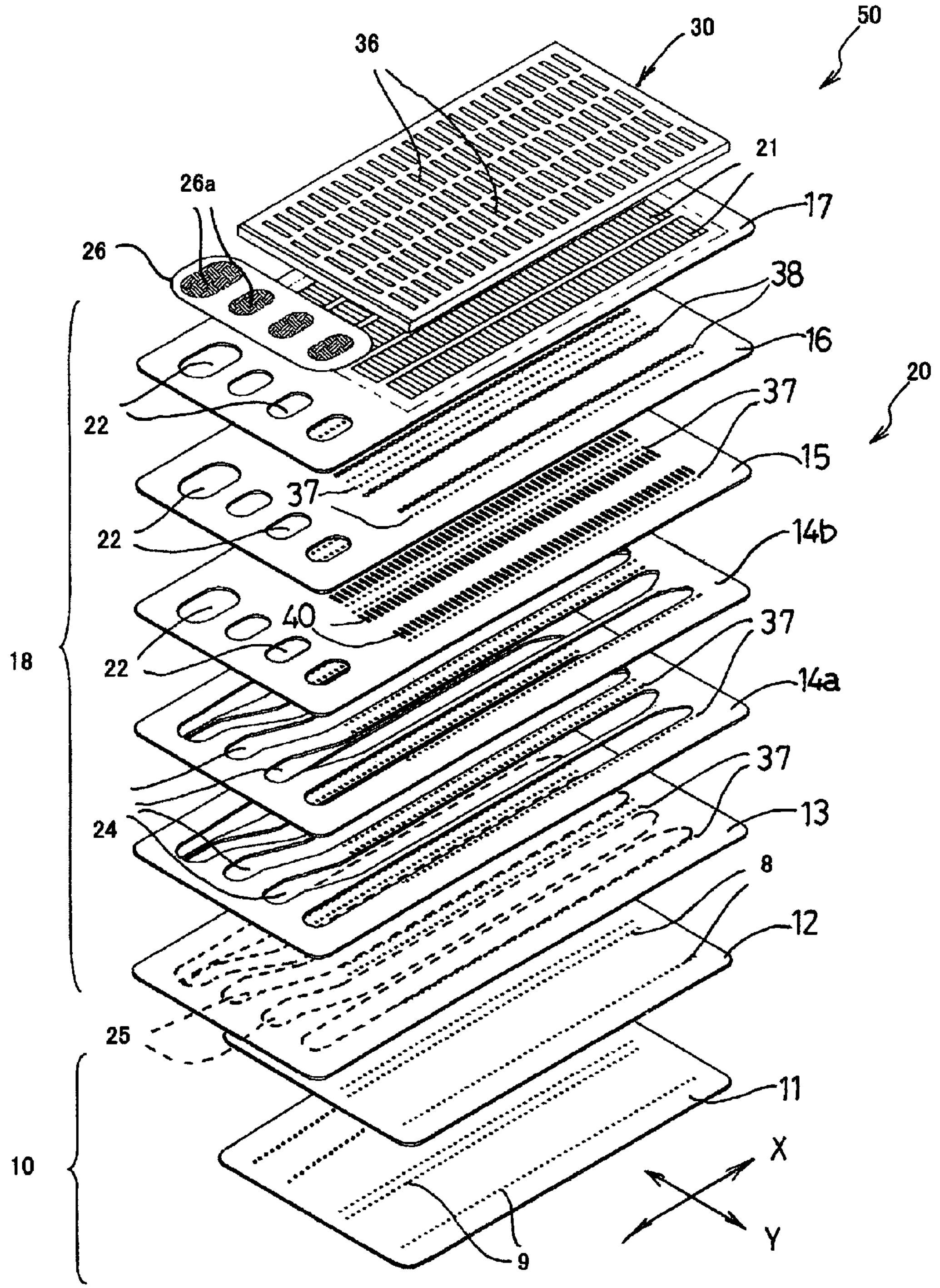
FIG. 3 is an exploded perspective view of a head unit 50.

The record head 2 has the same structure as a known one described in Japanese Patent Application Laid-Open No. 2004-25636, wherein a flexible wiring material 40 is joined at an upper face of the head unit 50 composed of a cavity unit 20 and the actuator 30 as shown in FIG. 2. The flexible wiring material 40 is provided with the drive circuit 49 and is constructed so that one end thereof is joined with and electrically connected with the actuator 30 and the other end thereof is extracted parallel to the surface thereof in the Y direction. The drive circuit 49 transmits printing data to the actuator 30 so as to selectively drive the actuator 30. The extracted wiring material 40 goes through a slit 3*c*1 formed through the bottom wall 3*c* of the head holder 3, brings the drive circuit 49 into contact with the radiator plate 4, extends upward along a side wall 3*a* of the head holder 3 and is electrically connected with a connector 6*a* of the junction circuit board 6 as shown in FIG. 5B.

The radiator plate 4 comprises a bottom portion 4*a* having a flat face, a side wall 4*b*1 which stands perpendicularly from the bottom portion 4*a* to have substantially an L-shape side view and extends vertically and a side wall 4*b*2 which bends perpendicularly from the side wall 4*b*1 to have substantially an L-shape plan view, and is attached to the bottom wall 3*c* of the head holder 3. An elastic member 52 (FIG. 5B) is bonded and fixed at a position of the bottom wall 3*c* of the head holder 3 corresponding to the drive circuit 49. The drive circuit 49 is mounted on and pressed against the elastic member 52 so as to come in contact with the bottom portion 4*a* of the radiator plate 4 in a thermally-conductive manner. The radiator plate 4 is made of a conductive material (e.g., metal material such as aluminum) and the elastic member 52 is made of a material such as rubber or resin to have a larger size than a lower face of the drive circuit 49.

The following description will explain the head unit 50. The head unit 50 is constructed by bonding the plate-type actuator 30 for applying discharge pressure selectively to ink in the cavity unit 20, on the cavity unit 20 having a nozzle plate 11 provided with the arranged nozzles 9 at the bottom face. The cavity unit 20 is constructed by bonding and joining a plurality of thin plates as shown in FIGS. 2 and 3 and is composed of a nozzle unit 10 and a flow channel unit 18. As shown in FIGS. 2 and 3, the nozzle unit 10 has a planar dimension smaller than that of the flow channel unit 18 both in the longitudinal direction (X direction) and in the lateral direction (Y direction) and has substantially the same planar dimension as that of the actuator 30. The actuator 30 is bonded at a face of the flow channel unit 18 opposite to the face where the nozzle unit 10 is bonded and at a position facing the nozzle unit 10.

The nozzle unit 10 is constructed by laminating and bonding two plates, i.e. the nozzle plate 11 and a spacer plate 12, which have substantially the same planar dimensions, via adhesive. The flow channel unit 18 is constructed by laminating and bonding six thin plate materials, i.e. a damper plate 13, two manifold plates 14*a* and 14*b*, a supply plate 15, a base plate 16 and a cavity plate 17, which have substantially the same planar dimensions, respectively via adhesive. Each of the plates 11-17 in the present embodiment has a thickness of approximately 50-150 μm, and the nozzle plate 11 is made of synthetic resin such as polyimide while the other plates 12-17 are made of a 42% nickel alloy steel panel. The cavity unit 20 is formed by bonding the nozzle unit 10 and the flow channel unit 18, which have been formed separately, with each other by adhesive.

At the nozzle plate 11 of the nozzle unit 10, the nozzles 9 are formed as holes arranged in 5 lines in the Y direction in zigzag alignment along the longitudinal direction (X direction). At the spacer plate 12, communicating holes 8 for communicating the nozzles 9 and pressure chambers 21 which will be explained later are formed at positions corresponding to the nozzles 9. At the nozzle plate 11 in the present embodiment, a great number of nozzles 9 having a minute diameter (approximately 20 μm) are formed as holes at minute intervals.

Figure 4:
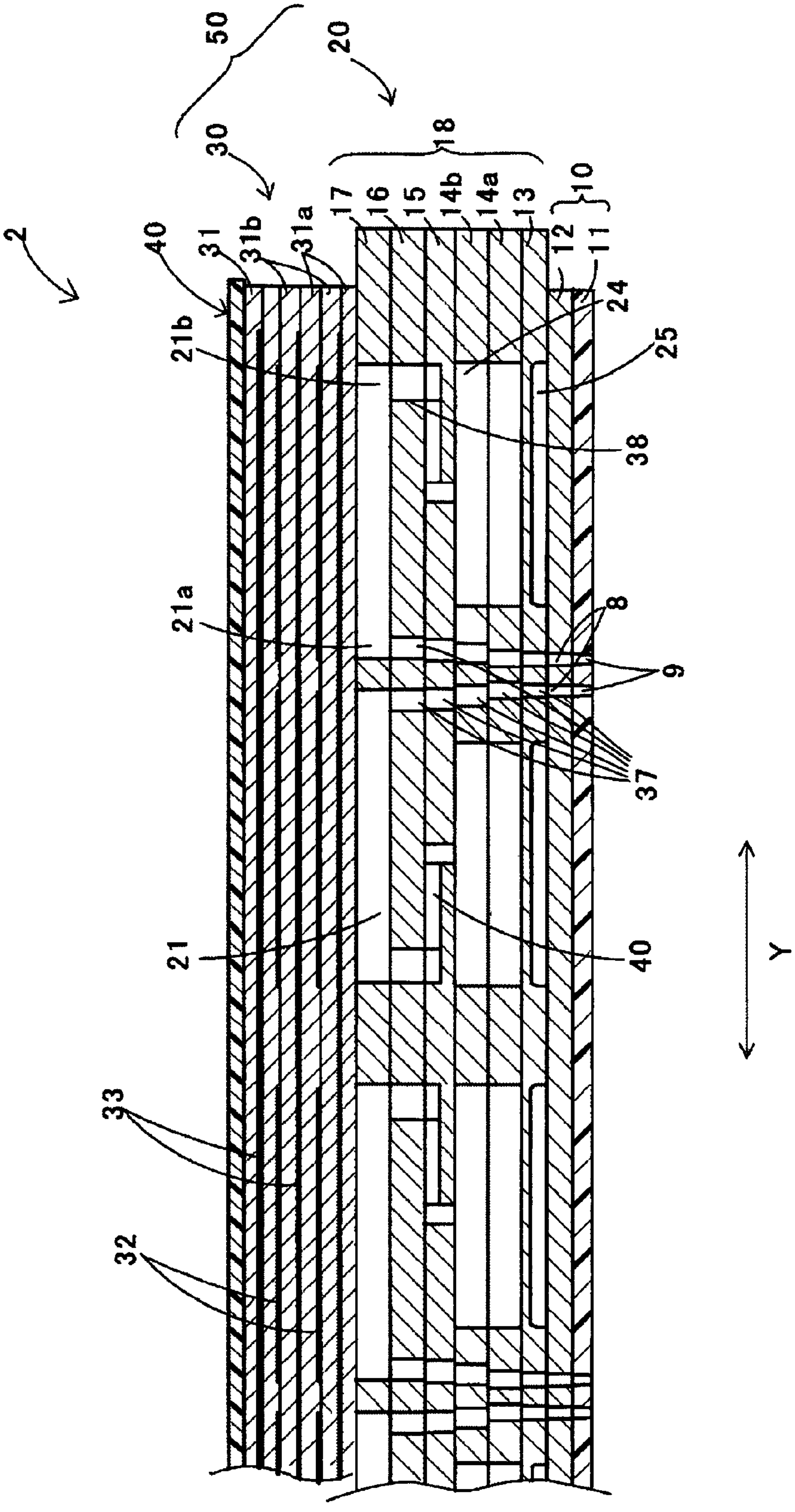
FIG. 4 is a sectional view of the record head 2 along the line C-C in FIG. 2.

At the cavity plate 17 of the flow channel unit 18, a plurality of pressure chambers 21 corresponding to the nozzles 9 are arranged in 5 lines in the Y direction in zigzag alignment along the longitudinal direction (X direction) of the cavity plate 17. Each pressure chamber 21 in the present embodiment is formed as a hole having an elongated plan view, the longitudinal direction of which is along the short side direction (Y direction) of the cavity plate 17 as shown in FIG. 4. One end portion 21*a* of each pressure chamber 21 is communicated with each nozzle 9 of the nozzle plate 11 via each of through holes 37 (ink flow channels) formed similarly to have a minute diameter in zigzag alignment respectively at the base plate 16, the supply plate 15, the two manifold plates 14*a* and 14*b* and the damper plate 13, and each of the communicating holes 8 formed similarly to have a minute diameter in zigzag alignment at the spacer plate 12.

At the base plate 16 lying next to the lower face of the cavity plate 17, through hole 38 is formed at a position corresponding to other end portion 21*b* of each pressure chamber 21 to be connected with the other end portion 21*b*, At the supply plate 15 lying next to the lower face of the base plate 16, connecting flow channels 40 for supplying ink from common ink chambers 24, which will be explained later, to the respective pressure chambers 21 are provided. Each connecting flow channel 40 comprises: an entrance hole through which ink from each common ink chamber 24 enters; an exit hole having an opening at the pressure chamber 21 side (through hole 38); and a restriction portion which is formed between the entrance hole and the exit hole to have a small sectional area so as to be the largest flow channel resistance in the connecting flow channel 40.

At the two manifold plates 14*a* and 14*b*, five common ink chambers 24 elongated in the long side direction (X direction) are formed to extend along each line of the nozzles 9 through the plate thickness. That is, a total of five common ink chambers (manifold chambers) 24 are formed by laminating the two manifold plates 14*a* and 14*b*, covering the upper face thereof with the supply plate 15 and covering the lower face with the damper plate 13 as shown in FIGS. 3 and 4. Each common ink chamber 24 is elongated along the line direction (line direction of the nozzles 9) of the pressure chambers 21 so as to be superposed with a portion of the pressure chambers 21 in a plan view from the lamination direction of each plate.

At an end portion of one short side of the cavity plate 17, the base plate 16 and the supply plate 15, four ink feed openings 22 are respectively formed with vertical positions being matched with each other. Ink supplied from the ink reservoir 5 is supplied to one end portion of the common ink chamber 24 via the ink feed opening 22. Ink is then distributed to each pressure chamber 21 through each connecting flow channel 40 of the supply plate 15 and flows from each pressure chamber 21 through the through hole 37 and the communicating hole 8 to the nozzle 9 corresponding to the pressure chamber 21 by selective drive of the actuator 30.

At the lower face of the damper plate 13 lying next to the lower face of the manifold plate 14*a*, each of damper chambers 25 having a form matched with a common ink chamber 24 is formed as a recess at a position matched with the common ink chamber 24 wherein a change in pressure is absorbed and damped and crosstalk is prevented when a thin plate head portion of the damper chamber 25 becomes deformed elastically and vibrates.

In the present embodiment, as shown in FIG. 3, four ink feed openings 22 are provided while five common ink chambers 24 are provided, wherein only one ink feed opening 22 has a large hole size and is connected with two common ink chambers 24 and 24. Black ink is to be supplied to the large ink feed opening 22, on the ground that black ink is used more frequently than other color ink. The respective ink of yellow, magenta and cyan is respectively supplied individually in the other ink feed openings 22. A filter member 26 having a filter portion 26*a* corresponding to each ink feed opening 22 is attached to ink feed openings 22 by adhesive or the like.

The actuator 30 has the same structure as a known one described in Japanese Patent Application Laid-Open No. 2005-322850 as shown in FIG. 4, wherein a plurality of ceramics layers 31 including a ceramics layer at the bottom layer for covering the plurality of pressure chambers 21 are laminated in a direction perpendicular to the face where the plurality of pressure chambers 21 are arranged, and are united and calcined. At an upper face (wide face) of each of ceramics layers 31*b* at an even number tier from the bottom of the respective ceramics layers 31, narrow individual electrodes 32 are formed in a line along the Y direction at positions corresponding to the respective pressure chambers 21 at the cavity unit 20. At an upper face (wide face) of each of ceramics layers 31*a* at an odd number tier from the bottom, a common electrode 33 is formed for the plurality of pressure chambers 21. Each ceramics layer 31 has a thickness of approximately 30 μm and is made of piezoelectric ceramics such as PZT. The individual electrodes 32 and the common electrodes 33 are arranged alternately in the lamination direction with at least one ceramics layer 31 being sandwiched therebetween, and connecting terminals 36 connected with the individual electrodes 32 and the common electrodes 33 are formed at the top face of the actuator 30. The cavity unit 20 and the actuator 30 are bonded and fixed with each other with each individual terminal 32 at the actuator 30 and each pressure chamber 21 at the cavity unit 20 facing each other. A wiring pattern formed on the flexible wiring material 40 is connected with the connecting terminals 36 at the top face of the actuator 30.

A portion of each ceramics layer 31 between the individual electrode 32 and the common electrode 33 facing each other in the lamination direction of the plurality of ceramics layers 31 functions as an energy generating unit in the actuator 30. When the drive circuit 49 selectively applies voltage across the individual electrode 32 and the common electrode 33, the energy generating unit corresponding to the individual electrode 32 to which voltage is applied is deformed in the lamination direction and this displacement causes a change in the volume of the pressure chamber 21 and pushes ink out to be discharged from the nozzle 9 through the through hole 37 and the communicating hole 8 in the cavity unit 20.

As described above, the nozzle unit 10 and the actuator 30 are bonded with the flow channel unit 18 at positions facing each other and have substantially the same planar dimensions which are smaller than the planar dimension of the flow channel unit 18. Since the record head 2 is formed by bonding the nozzle unit 10, the flow channel unit 18 and the actuator 30, the nozzle unit 10 and the actuator 30 in such a structure can share the adhesion pressure when the nozzle unit 10 and the actuator 30 are bonded with the flow channel unit 18 and the three members can be bonded reliably.

Figure 5A:
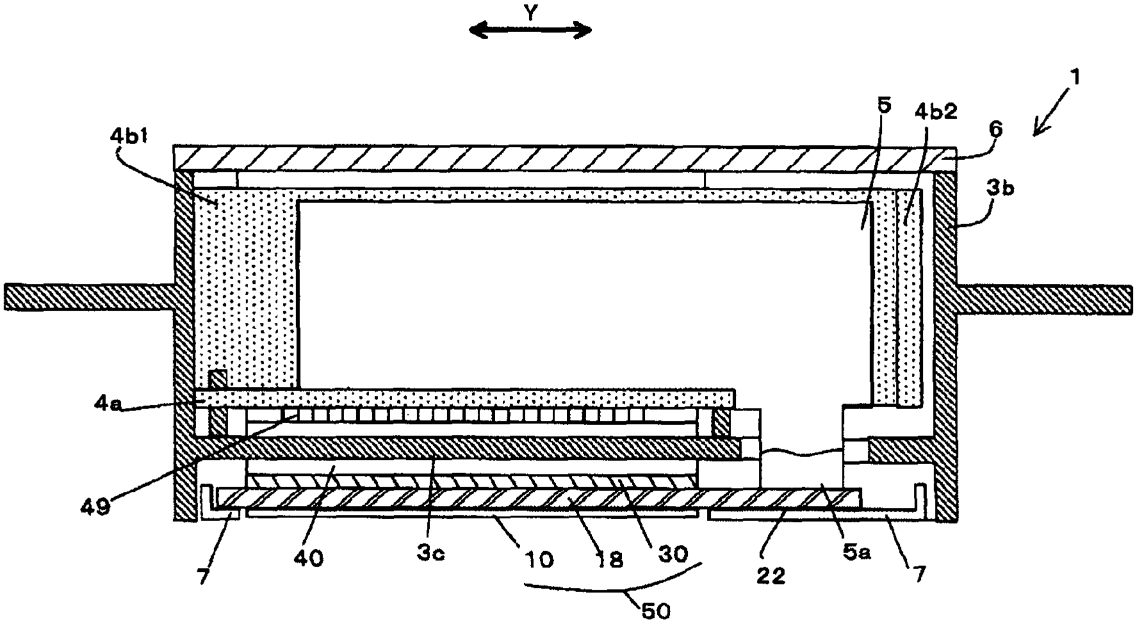
FIG. 5A is a sectional view along the line A-A in FIG. 1.
Figure 5B:
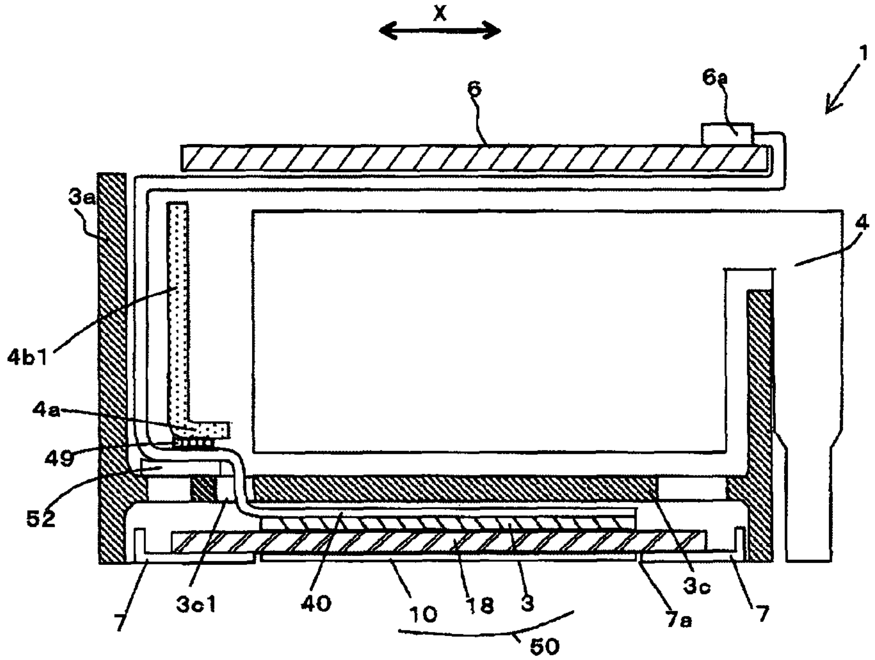
FIG. 5B is a sectional view along the line B-B in FIG. 1.

As shown in FIGS. 5A and 5B, a cover plate 7 for protecting the nozzles 9 is bonded at a face of the flow channel unit 18, where the nozzle unit 10 is bonded, by adhesive (not illustrated). The cover plate 7 has a rectangular plan view and is formed with a thin plate material made of synthetic resin. The cover plate 7 has a shape of a frame having an opening portion 7*a* formed at a position corresponding to the nozzle unit 10 and the cover plate 7 and the flow channel unit 18 are bonded and fixed so that the nozzle unit 10 is exposed from the opening portion 7*a*, The cover plate 7 has a thickness slightly larger than a thickness of the nozzle unit 10 and slightly protrudes downward from the nozzle unit 10 when bonded with the flow channel unit 18. Accordingly, there is a small risk that the nozzle face of the nozzle unit 10 comes in contact with recording paper while the ink jet print head 1 is scanning on the recording paper. Since the nozzle unit 10 in the present embodiment is smaller than the flow channel unit 18 and the distance between the opening portion 7*a* of the cover plate 7 and the position where the nozzles 9 of the nozzle unit 10 are arranged is small, it is possible to reduce the risk that the nozzles 9 come in contact with recording paper in comparison to a conventional structure wherein the flow channel unit 18 and the nozzle unit 10 have substantially the same sizes.

It should be noted that the present disclosure is not limited to the present embodiment wherein the nozzle unit 10 and the actuator 30 have substantially the same planar dimensions and are bonded with the flow channel unit 18 at positions facing each other. The actuator 30 may have a larger planar dimension or a smaller planar dimension than that of the nozzle unit 10 as long as the nozzle unit 10 and the actuator 30 are bonded with the flow channel unit 18 at substantially the same positions facing each other. In this case, however, the three members are bonded in the adhesion order which will be explained later.

The following description will explain a manufacturing method of the ink jet print head 1.

The record head 2 will be explained first. The record head 2 is manufactured by respectively preparing the nozzle unit 10, the flow channel unit 18 and the actuator 30 separately, bonding and joining the three members and then joining the flexible wiring material 40 provided with the drive circuit 49 at the top face thereof.

The actuator 30 is prepared by laminating the ceramics layers 31 provided with the respective electrodes 32 and 33 and calcining the assembly.

Figure 6:
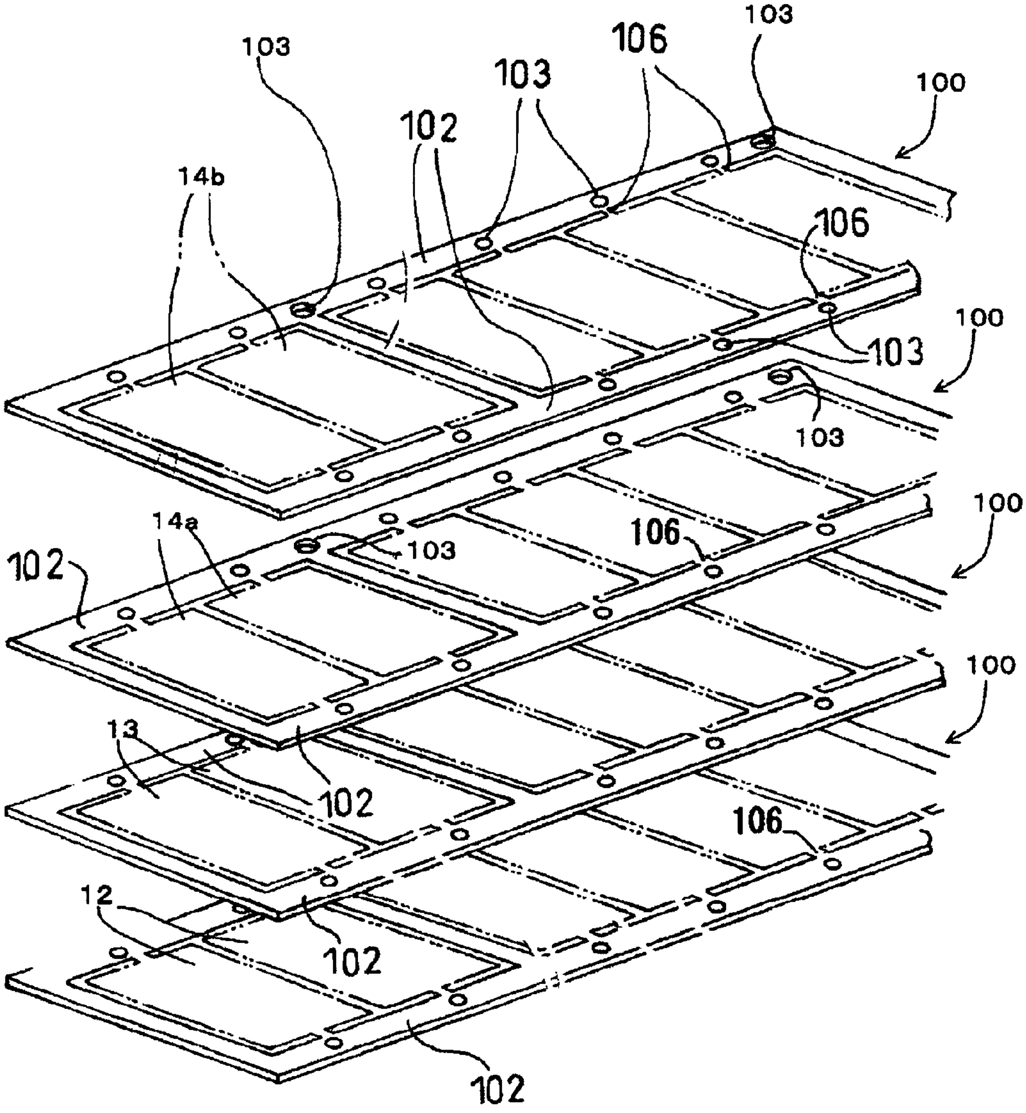
FIG. 6 is a view showing manufacturing process step of a flow channel unit 18.

Each of the spacer plate 12, the damper plate 13, the two manifold plates 14*a* and 14*b*, the supply plate 15, the base plate 16 and the cavity plate 17 is formed by arranging a plurality of plates of the same kind at one plate material 100 and surrounding the outer periphery thereof with frames 102 as shown in FIG. 6, with each plate and each frame 102 being coupled with each other by a coupling piece 106. Though FIG. 6 shows only the plates 12, 13, 14*a* and 14*b*, the same goes for the other plates 15, 16 and 17. In this state, machining of the outer shape of each of the plates 12-17 and machining of holes and recesses necessary for each plate are performed simultaneously. That is, the recesses, through holes in the plate thickness direction and the like at each of the plates 12-17 made of metal, such as the ink feed openings 22, the common ink chambers 24, the through holes 37, the communicating holes 8, the connecting flow channels 40 and the damper chambers 25, are formed by etching, electric discharge machining, plasma arc cutting, laser beam machining or the like.

The flow channel unit 18 is then prepared by laminating plates 13-17, excluding the spacer plate 12, of the above plates with the respective plates being located mutually by inserting a locating jig into a locating hole 103 provided at each frame 102 and bonding the plates with each other by adhesive. Here, uniform adhesion at the entire face of plates can be achieved by bringing flat jigs (not illustrated) having substantially the same planar dimension as the planar dimensions of the plates, or a larger planar dimension, into contact with the upper face and the lower face of the laminated plates so as to apply uniform pressure to the entire face and heating the plates. It should be noted that adhesion is achieved by preliminarily spreading, or forming by printing, adhesive on one face of facing plates and heating the plates. The same goes for the following adhesion.

In the nozzle unit 10, a plurality of plates (first plate materials) without nozzles, which are to be the nozzle plates 11, are respectively bonded, by adhesive, with the spacer plates 12 which are surrounded by and coupled with the frames 102, of one plate material 100 as described above. In this adhesion, uniform pressure is also applied to the entire face of the plates and the plates are heated. The communicating holes 8 penetrating the plate thickness direction are preliminarily formed at the spacer plates 12 (second plate materials) at positions corresponding to positions where the nozzles 9 are provided, by etching, laser beam machining or the like, similarly to Japanese Patent Application Laid-Open No. 2005-246779, The first plate material, which has not been provided with the nozzles 9 yet and is to be the nozzle plate 11, is bonded at the lower side of the processed spacer plate 12 (second plate material) and laser is then radiated from the spacer plate 12 side through the communicating holes 8 to the first plate material to form the nozzles 9 at the first plate material.

Figure 7A:
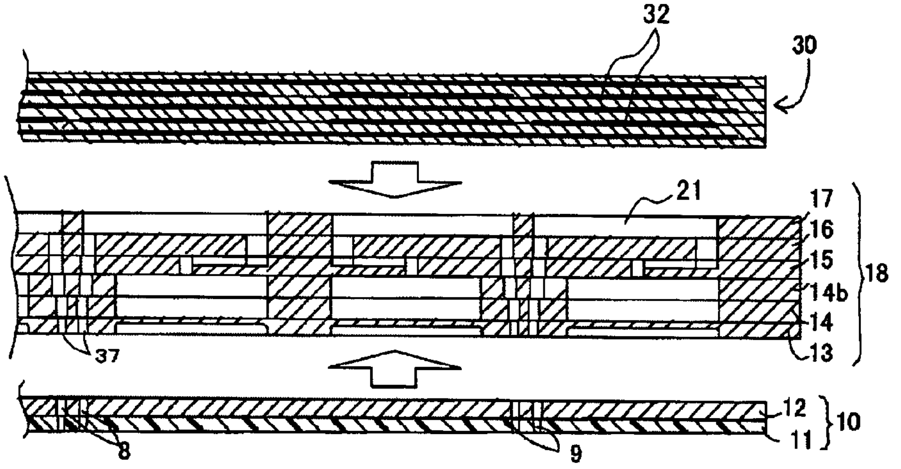
FIGS. 7A and 7B are views showing manufacturing process step of a nozzle unit 10, the flow channel unit 18 and an actuator 30.
Figure 7B:
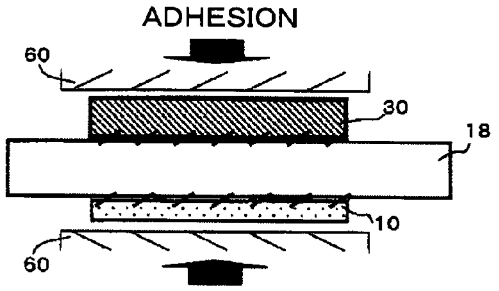

The nozzle unit 10 prepared as described above and the flow channel unit 18 are located by inserting locating jigs into the locating holes 103 of the frames 102 and laminated so that the communicating holes 8 and the through holes 37 are communicated with each other. Furthermore, the piezoelectric actuator 30 is laminated on the flow channel unit 18 with the individual electrodes 32 and the pressure chambers 21 facing each other as described above (FIG. 7A). As shown in FIG. 7B, flat jigs 60 and 60 having substantially the same planar dimension as the planar dimension of the nozzle unit 10 and the piezoelectric actuator 30, or a larger planar dimension, are brought into contact with the lower face of the nozzle unit 10 and the upper face of the actuator 30 so as to apply uniform pressure to the entire face and the members are heated, so that the nozzle unit 10 and the piezoelectric actuator 30 are bonded with the flow channel unit 18. Head units 50 can be respectively separated by cutting the coupling pieces 106 from the frames 102.

As described above, the nozzle unit 10 and the actuator 30 have substantially the same planar dimensions and are bonded simultaneously with the flow channel unit 18 at positions facing each other. Accordingly, the adhesion pressure to be applied to the flow channel unit 18 is substantially the same and the nozzle unit 10 and the actuator 30 can share substantially the same adhesion pressure to be applied to the flow channel unit 18. Accordingly, the nozzle unit 10 and the actuator 30 can be bonded with the flow channel unit 18 uniformly at the entire face. Moreover, simultaneous bonding makes it possible to decrease one process step and to enhance the productivity.

It should be noted that the nozzle unit 10 and the actuator 30 do not always have to be bonded simultaneously, and any one thereof may be bonded with the flow channel unit 18 first and the other may be then bonded at a position facing the former. In this case, the adhesion pressure of the two members is also substantially the same, the two members can share the pressure and preferable adhesion properties can be obtained. For example, the flow channel unit 18 and the nozzle unit 10, which are respectively coupled with the frames 102, are laminated and bonded, the coupling pieces 106 are then cut off so as to form the respectively separate cavity units 20, and the piezoelectric actuator 30 is bonded on the cavity unit 20. Alternatively, the nozzle unit 10 can be bonded after the piezoelectric actuator 30 is bonded on the flow channel unit 18.

Figure 8A:
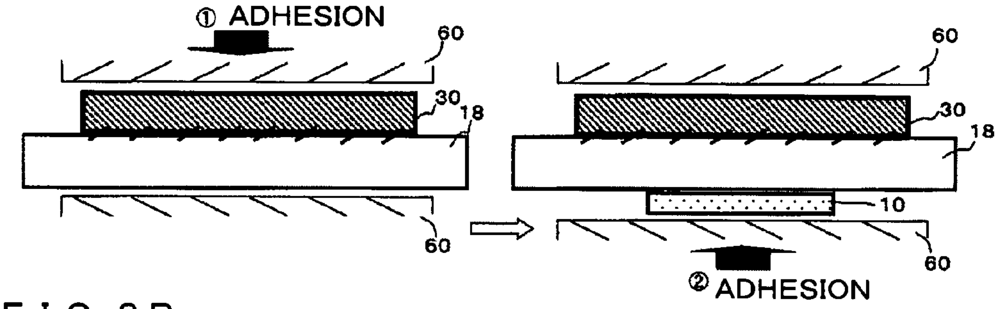
FIGS. 8A and 8B are views showing manufacturing process steps of the nozzle unit 10, the flow channel unit 18 and the actuator 30.
Figure 8B:
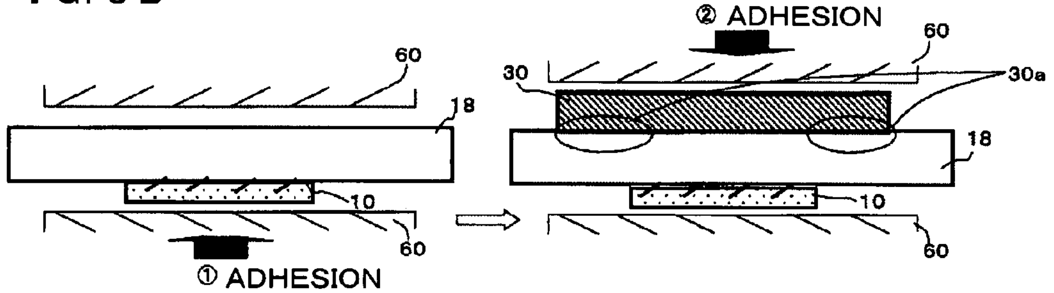

When the planar dimension of the nozzle unit 10 is smaller than that of the actuator 30 as shown in FIG. 8A, the actuator 30 having a larger bonding area with the flow channel unit 18 is bonded first with the flow channel unit 18 and the nozzle unit 10 is then bonded at a position facing the actuator 30. Since the actuator 30 is brought first into contact with the flow channel unit 18 uniformly at the entire face by being sandwiched with the flat jigs 60 and 60, which have substantially the same planar dimensions as the planar dimension of the actuator 30 or larger planar dimensions, from the upper side and the lower side, the entire actuator 30 can be bonded reliably. Accordingly, by sandwiching the members from the upper side and the lower side with the flat jigs 60 and 60 having at least substantially the same planar dimensions as that of the nozzle unit 10 or a larger planar dimensions in order to bond the nozzle unit 10 having a smaller planar dimension afterward, the actuator 30 has already been bonded with the flow channel unit 18 and the nozzle unit 10 can also be bonded reliably with the flow channel unit 18 at the entire face regardless of the influence of the adhesion pressure even when the adhesion pressure concentrates on a portion of the actuator 30 corresponding to the area of the nozzle unit 10. In the comparative example in FIG. 8B, the nozzle unit 10 having a smaller planar dimension is first bonded with the flow channel unit 18 and the actuator 30 having a planar dimension larger than that of the nozzle unit 10 is then bonded at a position facing the nozzle unit 10. In such formation, pressure of bonding of the actuator 30 concentrates on the nozzle unit 10 having a smaller planar dimension and adhesion at both end portions 30*a* of the actuator 30 becomes insufficient.

The same goes for a case where the actuator 30 has a planar dimension smaller than that of the nozzle unit 10, and the nozzle unit 10 having a larger planar dimension is first bonded with the flow channel unit 18 and the actuator 30 is then bonded at a position facing the nozzle unit 10. In such adhesion, the three members can be bonded reliably.

The record head 2 is completed by joining the flexible wiring material 40 on the upper face of the head unit 50 formed as described above. The ink jet print head 1 is completed by mounting the record head 2 on the bottom wall 3*c* of the head holder 3, mounting the radiator plate 4 and the ink reservoir 5 inside the head holder 3 and placing the junction circuit board 6 at a side wall 3*b* of the head holder 3. The cover plate 7 is then bonded with a face of the flow channel unit 18 where the nozzle unit 10 is bonded, with the nozzle unit 10 being exposed from the opening portion 7*a* of the cover plate 7.

As described above, since the three members, i.e. the actuator 30, the nozzle unit 10 and the flow channel unit 18, are preliminarily formed separately and are then bonded with each other, a plurality of plates of the flow channel unit 18 are bonded with each other reliably regardless of the size of the nozzle unit 10 and the actuator 30 and ink leakage can be prevented. Moreover, since the actuator 30 and the nozzle unit 10 have substantially the same planar dimensions and are bonded with the flow channel unit 18 at positions facing each other, the actuator 30 and the nozzle unit 10 can be bonded reliably with the flow channel unit 18. Even when the actuator 30 and the nozzle unit 10 have different planar dimensions, the three members can be bonded reliably even under the influence of the adhesion pressure, by bonding one of the actuator 30 and the nozzle unit 10 having a larger planar dimension with the flow channel unit 18 first and then bonding the other one at a facing position. As a result, it is possible to manufacture an ink jet print head which operates stably without ink leakage while the actuator operates uniformly for the respective pressure chambers.

With the present embodiment, since the bonding step is a step of bonding a nozzle unit and an actuator having substantially the same planar dimensions with a flow channel unit simultaneously, it is possible to decrease a process step and the productivity is enhanced. Moreover, since the nozzle unit and the actuator share the adhesion pressure to be applied to the flow channel unit, it is possible to bond the two members reliably.

With the present embodiment, since the bonding step is a step of bonding a nozzle unit and an actuator having substantially the same planar dimensions with a flow channel unit separately, the nozzle unit and the actuator share the adhesion pressure to be applied to the flow channel unit and it is possible to bond the two members reliably.

With the present embodiment wherein a first plate material without a nozzle and a second plate material provided with communicating holes to be communicated with pressure chambers are laminated and nozzles are then formed at the first plate material through the communicating holes from the second plate material side, it is possible to ensure a high accuracy of the hole size and the position of the nozzles at the time of nozzle formation.

With the present embodiment wherein the flow channel unit is formed separately from the nozzle unit and from the actuator by laminating and bonding a plurality of plates provided with pressure chambers or ink flow channels to be communicated with the pressure chambers respectively, the flow channel unit can be preliminarily manufactured without in-plane dispersion of bonding between the respective plates. Accordingly, it is possible to prevent ink leakage. Moreover, since each ink flow channel is communicated with a communicating hole of the second plate material when the flow channel unit and the nozzle unit are laminated, ink from the pressure chambers can be supplied to the nozzles and ink can be discharged when the head unit is formed.

With the present embodiment, the flow channel unit is formed separately from the nozzle unit by laminating and bonding a plurality of plates provided with pressure chambers or ink flow channels to be communicated with the pressure chambers respectively. Moreover, the nozzle unit is formed separately from the flow channel unit by laminating and bonding the first plate material formed to have a planar dimension smaller than that of the flow channel unit and the second plate material. Since the flow channel unit and the nozzle unit are then laminated and bonded, the flow channel unit can be preliminarily manufactured without in-plane dispersion of bonding between the respective plates of the flow channel unit even when the flow channel unit has a planar dimension larger than that of the nozzle unit. Accordingly, it is possible to prevent ink leakage. Furthermore, the nozzle unit can be bonded with the flow channel unit reliably. Moreover, since the respective parts which have already been formed reliably are bonded with each other, it is possible to maintain the interrelationship with a high accuracy and to manufacture an ink jet print head which operates stably.

With the present embodiment wherein the first plate material without a nozzle and the second plate material provided with communicating holes are laminated and bonded and nozzles are then formed at the first plate material through the communicating holes from the second plate material side in the step of forming the nozzle unit, it is possible to ensure a high accuracy of the hole size and the position of the nozzles at the time of nozzle formation.

With the present embodiment wherein the cover plate is bonded at a face of the flow channel unit where the nozzle unit is bonded and at a position surrounding the nozzle unit, it is possible to protect the neighborhood of the nozzles with the cover plate.

With the present embodiment wherein the cover plate is placed at a face of the flow channel unit where the nozzle unit is bonded and the cover plate has the shape of a frame having an opening portion, from which the nozzle unit is exposed, at a position corresponding to the nozzle unit, it is possible to protect the neighborhood of the nozzles with the cover plate.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

What is claimed is:

1. A manufacturing method of an ink jet print head comprising:

a nozzle unit forming step of forming a nozzle unit having a nozzle plate in which a nozzle for discharging ink is disposed;

a flow channel unit forming step of forming a plate flow channel unit which is to be bonded to the nozzle unit, has a pressure chamber for communicating with the nozzle, and has a planar dimension in a width direction and depth direction of the plate flow channel unit larger than that of the nozzle unit;

an actuator forming step of forming an actuator which is to be bonded at a face of the flow channel unit opposite to a face where the nozzle unit is to be bonded and has a substantially same planar dimension in a width direction and depth direction of the actuator as that of the nozzle unit, for applying pressure to ink in the pressure chamber so as to discharge ink from the nozzle;

a bonding step of bonding the nozzle unit formed by the nozzle unit forming step and the actuator formed by the actuator forming step to the flow channel unit formed by the flow channel unit forming step at positions facing each other, respectively, thereby manufacturing the ink jet print head in which the nozzle unit, the flow channel unit and the actuator are laminated; and wherein the bonding step is a step of bonding the nozzle unit and the actuator to the flow channel unit simultaneously, respectively.

2. The manufacturing method of an ink jet print head according to claim 1;

wherein the nozzle unit forming step includes a step of laminating and bonding a first plate material without a nozzle and a second plate material provided with a communicating hole to be communicated with the pressure chamber, and then forming a nozzle at the first plate material through the communicating hole from a second plate material side, so as to form the nozzle plate.

3. The manufacturing method of an ink jet print head according to claim 2;

where in the flow channel unit is formed by laminating and bonding a plurality of plates provided with the pressure chamber or an ink flow channel to be communicated with the pressure chamber respectively in the flow channel unit forming step, and the ink flow channel is communicated with the communicating hole of the second plate material.

4. The manufacturing method of an ink jet print head according to claim 1, further comprising:

a step of bonding a cover plate at a face of the flow channel unit where the nozzle unit is bonded and at a position surrounding the nozzle unit.

* * * * *